(12) United States Patent
Bobel et al.

(10) Patent No.: US 12,040,479 B2
(45) Date of Patent: Jul. 16, 2024

(54) TEXTURED METAL SUBSTRATES FOR NEGATIVE ELECTRODES OF LITHIUM METAL BATTERIES AND METHODS OF MAKING THE SAME

(71) Applicant: GM GLOBAL TECHNOLOGY OPERATIONS LLC, Detroit, MI (US)

(72) Inventors: Andrew C. Bobel, Troy, MI (US); Louis G. Hector, Jr., Shelby Township, MI (US); Anil K. Sachdev, Rochester Hills, MI (US); Jeffrey D. Cain, Royal Oak, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 217 days.

(21) Appl. No.: 17/359,817

(22) Filed: Jun. 28, 2021

(65) Prior Publication Data

US 2022/0416220 A1   Dec. 29, 2022

(51) Int. Cl.
*H01M 4/00* (2006.01)
*C30B 7/12* (2006.01)
(Continued)

(52) U.S. Cl.
CPC .............. *H01M 4/134* (2013.01); *C30B 7/12* (2013.01); *C30B 7/14* (2013.01); *C30B 19/103* (2013.01);
(Continued)

(58) Field of Classification Search
CPC .. H01M 4/134; H01M 4/1395; H01M 4/0404; H01M 10/0525; H01M 4/0452;
(Continued)

(56) References Cited

U.S. PATENT DOCUMENTS 11,552,284 B2   1/2023   Huemiller
2010/0156353 A1* 6/2010   Iyer .................. H01M 4/366
                                                    427/78
(Continued)

FOREIGN PATENT DOCUMENTS

CN        115602851 A       1/2023
DE     102022110133 A1     12/2022
(Continued)

OTHER PUBLICATIONS

Miller Indices (Index) as evidenced by Wikipedia (Year: 2023).*
(Continued)

*Primary Examiner* — Cynthia H Kelly
*Assistant Examiner* — Monique M Wills
(74) *Attorney, Agent, or Firm* — Harness, Dickey & Pierce, P.L.C.

(57) ABSTRACT

A lithium metal negative electrode for an electrochemical cell for a secondary lithium metal battery includes a polycrystalline metal substrate having a major facing surface with a defined crystallographic texture. An epitaxial lithium metal layer is formed on the major facing surface of the polycrystalline metal substrate. The epitaxial lithium metal layer exhibits a predominant crystal orientation. The predominant crystal orientation of the epitaxial lithium metal layer is derived from the defined crystallographic texture of the major facing surface of the polycrystalline metal substrate.

20 Claims, 2 Drawing Sheets

(51) Int. Cl.
*C30B 7/14* (2006.01)
*C30B 19/10* (2006.01)
*C30B 28/04* (2006.01)
*C30B 29/02* (2006.01)
*C30B 30/02* (2006.01)
*H01M 4/04* (2006.01)
*H01M 4/134* (2010.01)
*H01M 4/1395* (2010.01)
*H01M 4/38* (2006.01)
*H01M 10/0525* (2010.01)
*H01M 4/02* (2006.01)

(52) U.S. Cl.
CPC ............ *C30B 28/04* (2013.01); *C30B 29/02* (2013.01); *C30B 30/02* (2013.01); *H01M 4/0404* (2013.01); *H01M 4/0452* (2013.01); *H01M 4/1395* (2013.01); *H01M 4/382* (2013.01); *H01M 10/0525* (2013.01); *H01M 2004/027* (2013.01)

(58) Field of Classification Search
CPC ........... C30B 7/12; C30B 7/14; C30B 19/103; C30B 28/04
See application file for complete search history.

(56) References Cited

U.S. PATENT DOCUMENTS

| | | | |
|---|---|---|---|
| 2018/0198131 A1* | 7/2018 | Ujihara | ............ H01M 10/0569 |
| 2019/0257794 A1 | 8/2019 | McGovern et al. | |
| 2022/0069273 A1 | 3/2022 | Huemiller et al. | |
| 2022/0069312 A1 | 3/2022 | Irish et al. | |
| 2022/0271264 A1 | 8/2022 | Xu et al. | |

FOREIGN PATENT DOCUMENTS

| | | | |
|---|---|---|---|
| JP | H11288706 | * | 3/1998 |
| WO | WO2020114050 A1 | | 6/2020 |

OTHER PUBLICATIONS

Expitaxy as evidenced by Wikipedia (Year: 2023).*
JPH11288706 as taught by Matsui (Year: 1998).*
LibreTexts [Batteries: Electricity though chemical reactions]; UC Davis Library (Year: 2023).*
Ehsan Tolouei, Mohammad Reza Toroghinejad, Hamed Asgari, Hossein Monajati Zadeh, Fakhreddin Ashrafizadeh, Jerzy A. Szpunar, and Philippe Bocher, "Microstructure and Texture Development in AI-3%Brass Composite Produced through ARB", Advanced Engineering Materials, Nov. 2017, 9 pages.
Yun-Jung Kim, Sung Hyun Kwon, Hyungjun Noh, Seongmin Yuk, Hongkyung Lee, Hyun Soo Jin, Jinhong Lee, Ji-Guang Zhang, Seung Geol Lee, Hwanuk Guim and Hee-Tak Kim, "Facet selectivity of Cu current collector for Li elecrodeposition", Energy Storage Materials, 2019, pp. 154-162.
Feifei Shi, Allen Pei, Arturas Vailionis, Jin Xie, Bofei Liu, Jie Zhao, Yongji Gong and Yi Cui, "Strong texturing of lithium metal in batteries", Department of Materials Science and Engineering, Stanford University, PNAS, vol. 114, No. 46, Nov. 14, 2017, pp. 12138-12143.
Definition of Epitaxy—A Dictionary of Chemistry, 2020, Oxford University Press, p. 215.

* cited by examiner

TEXTURED METAL SUBSTRATES FOR NEGATIVE ELECTRODES OF LITHIUM METAL BATTERIES AND METHODS OF MAKING THE SAME

INTRODUCTION

The present disclosure relates to lithium metal batteries and, more particularly, to polycrystalline metal substrates with textured surfaces configured to direct the crystal orientation of lithium metal crystal grains deposited thereon during initial charging and recharging of the lithium metal batteries.

Secondary lithium batteries generally include one or more electrochemical cells having a negative electrode, a positive electrode, and an ionically conductive electrolyte that provides a medium for the conduction of lithium ions through the electrochemical cell between the negative and positive electrodes. The negative and positive electrodes are electrically isolated from one another within the electrochemical cell and may be spaced apart from one another by a porous polymeric separator. At the same time, the negative and positive electrodes are electrically connected to one another outside the electrochemical cell via an external circuit. In practice, each of the negative and positive electrodes is typically carried on an electrically conductive current collector and is connected to the external circuit via its respective current collector. The negative and positive electrode materials are formulated so that, when the battery is at least partially charged, an electrochemical potential difference is established between the negative and positive electrodes within the electrochemical cell.

Lithium metal is a desirable negative electrode material for secondary lithium batteries due to its high specific capacity (3,860 mAh/g) and its relatively low reduction potential (−3.04 V versus standard hydrogen electrode). When lithium metal is used as the negative electrode material in a secondary lithium metal battery, the electrochemical potential difference between the lithium metal negative electrode material and positive electrode material drives spontaneous reduction-oxidation (redox) reactions within the electrochemical cell during discharge of the battery. During discharge of a lithium metal battery, lithium metal in the negative electrode is oxidized to lithium ions ($Li^+$) and electrons. The lithium ions travel from the negative electrode to the positive electrode through the ionically conductive electrolyte, and the electrons travel from the negative electrode to the positive electrode via the external circuit, which generates an electric current. After the negative electrode has been partially or fully depleted of lithium, the electrochemical cell may be recharged by connecting the negative and positive electrodes to an external power source, which drives nonspontaneous redox reactions within the electrochemical cell. When the lithium metal battery is recharged, lithium metal stored in the positive electrode material is oxidized to lithium ions and electrons. The lithium ions are released from the positive electrode and travel through the electrolyte back to the negative electrode, wherein the lithium ions are reduced to lithium metal and deposited at the negative electrode, e.g., on the surface of the negative electrode current collector.

When a lithium metal battery is charged, lithium metal may deposit nonuniformly on the surface of the negative electrode current collector, which may result in the formation of branched lithium metal structures referred to as dendrites. These lithium metal dendrites may grow from the negative electrode to the positive electrode and, eventually, cause an internal short circuit. In addition, the nonuniform deposition of lithium metal on the surface of the negative electrode current collector may reduce the amount of lithium metal in the electrochemical cell available to participate in the necessary redox reactions occurring within the electrochemical cell, which may reduce the cycle life of the battery.

It may be desirable to improve the uniformity at which lithium metal is deposited at the negative electrode (e.g., on the surface of the negative electrode current collector) of a lithium metal battery to improve the cycle life, as well as the charging and discharge rate of the battery.

SUMMARY

An electrochemical cell for a secondary lithium metal battery includes a positive electrode, a negative electrode spaced apart from the positive electrode, and a nonaqueous electrolyte in ionic contact with the positive electrode and the negative electrode. The positive electrode includes a positive electrode material layer disposed on a major surface of a positive electrode current collector. The negative electrode includes a polycrystalline metal substrate having a major facing surface with a defined crystallographic texture. An epitaxial lithium metal layer is formed on the major facing surface of the polycrystalline metal substrate. The epitaxial lithium metal layer exhibits a predominant crystal orientation. The predominant crystal orientation of the epitaxial lithium metal layer is derived from the defined crystallographic texture of the major facing surface of the polycrystalline metal substrate.

A major volume fraction of crystal grains in the epitaxial lithium metal layer may exhibit a fiber texture and may have an {h, k, $\ell$} lattice plane oriented substantially parallel to the major facing surface of the polycrystalline metal substrate, wherein h, k, and $\ell$ are each, individually, 0, 1, 2, or 3.

A major volume fraction of crystal grains in the epitaxial lithium metal layer may exhibit a fiber texture of <110>, <100>, <111>, <102>, or <122>.

In aspects, the polycrystalline metal substrate may be made of a metal-based material, a primary constituent of the metal-based material may be copper (Cu), nickel (Ni), iron (Fe), titanium (Ti), aluminum (Al), or magnesium (Mg), and the epitaxial lithium metal layer may be formed directly on the polycrystalline metal substrate via heteroepitaxy. In such case, the polycrystalline metal substrate may exhibit a body-centered cubic (bcc) crystal structure, a face-centered cubic (fcc) crystal structure, a hexagonal close-packed (hcp) crystal structure, or a body-centered tetragonal (bct) crystal structure, and the epitaxial lithium metal layer may exhibit a body-centered cubic (bcc) crystal structure.

In aspects, the polycrystalline metal substrate may include a lithium metal template layer, the major facing surface of the polycrystalline metal substrate may be defined by the lithium metal template layer, and the epitaxial lithium metal layer may be formed directly on the lithium metal template layer via homoepitaxy.

The lithium metal template layer may exhibit a body-centered cubic (bcc) crystal structure, and the epitaxial lithium metal layer may exhibit a body-centered cubic (bcc) crystal structure.

The lithium metal template layer may be nonporous and may include an alloy of lithium and at least one alloying element of indium (In), tin (Sn), gallium (Ga), zinc (Zn), aluminum (Al), magnesium (Mg), silicon (Si), calcium (Ca), or sodium (Na). In aspects, the at least one alloying element may constitute, on an atomic basis, less than 1% of the lithium metal template layer.

The epitaxial lithium metal layer may be formed directly on the lithium metal template layer by an electrochemical deposition process during charging of the electrochemical cell.

The lithium metal template layer may be applied to a major surface of a negative electrode current collector prior to initial charging of the electrochemical cell.

The lithium metal template layer may have a thickness in a range of from 1 μm to 100 μm.

The positive electrode material layer may include a source of active lithium. In such case, the lithium metal template layer may provide the electrochemical cell with a stoichiometric surplus of lithium prior to initial charging of the electrochemical cell.

The positive electrode material layer may include an electrochemically active material configured to undergo a reversible redox reaction with lithium.

A method of making a lithium metal negative electrode for an electrochemical cell of a secondary lithium metal battery is disclosed. In the disclosed method, a major facing surface of a polycrystalline metal substrate is positioned in spaced-apart relationship with an electrochemically active material layer including lithium. An ionically conductive pathway is established between the major facing surface of the polycrystalline metal substrate and the electrochemically active material layer. An electrical potential is established between the polycrystalline metal substrate and the electrochemically active material layer such that lithium ions are released from the electrochemically active material layer and lithium metal is deposited on the major facing surface of the polycrystalline metal substrate to form an epitaxial lithium metal layer thereon. The major facing surface of the polycrystalline metal substrate exhibits a defined crystallographic texture. The epitaxial lithium metal layer exhibits a predominant crystal orientation, and the predominant crystal orientation of the epitaxial lithium metal layer is derived from the defined crystallographic texture of the major facing surface of the polycrystalline metal substrate.

A major volume fraction of crystal grains in the epitaxial lithium metal layer may exhibit a fiber texture and may have an {h, k, $\ell$} lattice plane oriented substantially parallel to the major facing surface of the polycrystalline metal substrate, wherein h, k, and $\ell$ are each, individually, 0, 1, 2, or 3.

A major volume fraction of crystal grains in the epitaxial lithium metal layer may exhibit a fiber texture of <110>, <100>, <111>, <102>, or <122>.

In aspects, the polycrystalline metal substrate may be made of a metal-based material, a primary constituent of the metal-based material may be copper (Cu), nickel (Ni), iron (Fe), titanium (Ti), aluminum (Al), or magnesium (Mg), and the epitaxial lithium metal layer may be formed directly on the polycrystalline metal substrate via heteroepitaxy.

In aspects, the polycrystalline metal substrate may include a lithium metal template layer, the major facing surface of the polycrystalline metal substrate may be defined by the lithium metal template layer, and the epitaxial lithium metal layer may be formed directly on the lithium metal template layer by homoepitaxy.

The electrochemically active material layer may include an electrochemically active material configured to undergo a reversible redox reaction with lithium.

The ionically conductive pathway may be established between the major facing surface of the polycrystalline metal substrate and the electrochemically active material layer by placing the major facing surface of the polycrystalline metal substrate and the electrochemically active material layer in direct physical contact with a nonaqueous electrolyte.

A method of making a lithium metal negative electrode for an electrochemical cell of a secondary lithium metal battery is disclosed. In the disclosed method, a defined crystallographic texture is imparted to a lithium metal foil such that a major volume fraction of crystal grains in the lithium metal foil exhibit a fiber texture of <110>, <100>, <111>, <102>, or <122>. The lithium metal foil is applied to a major surface of a negative electrode current collector. A major facing surface of the lithium metal foil is positioned in spaced-apart relationship with an electrochemically active material layer including lithium. The electrochemically active material layer is disposed on a major surface of a positive electrode current collector. An ionically conductive pathway is established between the major facing surface of the lithium metal foil and the electrochemically active material layer. An electrical potential is established between the negative electrode current collector and the positive electrode current collector such that lithium ions are released from the electrochemically active material layer and lithium metal is deposited via epitaxy on the major facing surface of the lithium metal foil to form an epitaxial lithium metal layer thereon. The epitaxial lithium metal layer exhibits a predominant crystal orientation. The predominant crystal orientation of the epitaxial lithium metal layer is derived from the defined crystallographic texture of the lithium metal foil.

The defined crystallographic texture may be imparted to the lithium metal foil by at least one of a mechanical surface treatment process or a heat treatment process. The mechanical surface treatment process may include a rolling treatment.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

BRIEF DESCRIPTION OF THE DRAWINGS

Illustrative embodiments will hereinafter be described in conjunction with the appended drawings, wherein like designations denote like elements, and wherein.

Figure 1:
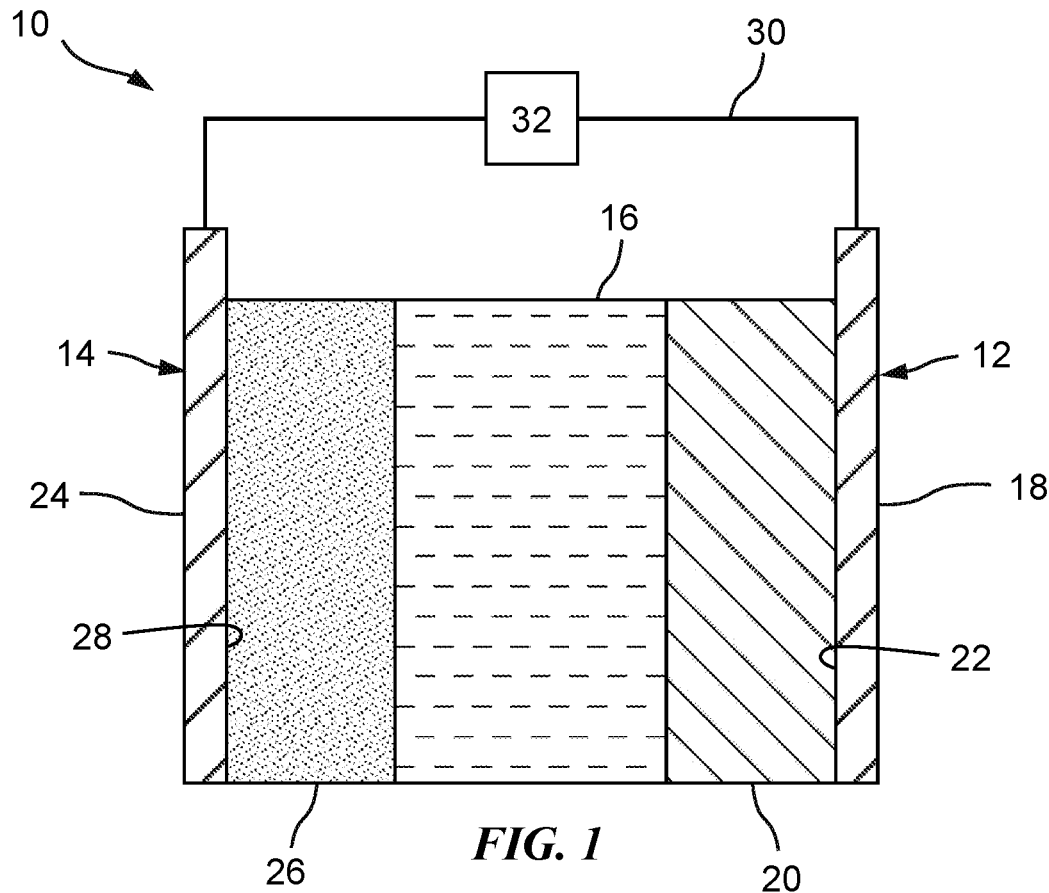
FIG. 1 is a schematic side cross-sectional view of an electrochemical cell of a secondary lithium metal battery, the electrochemical cell includes a pair of negative and positive electrodes in ionic contact with each other via a nonaqueous electrolyte, with the negative electrode including a negative electrode current collector and a negative electrode active material layer in the form of an epitaxial lithium metal layer on a major facing surface thereof.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

The presently disclosed electrochemical cells are configured to promote the uniform deposition or plating of lithium metal on their negative electrode current collectors during initial charging and repeated charging cycles thereof. To accomplish this, a defined crystallographic texture is imparted to surfaces of the negative electrode current collectors or to overlying template layers, with the defined crystallographic texture being selected to promote the epitaxial crystal growth of lithium metal thereon. The terms "epitaxy," "epitaxial," and "epitaxially" refer to processes in which a layer of crystalline material is deposited or grown on another crystalline material or substrate, with a crystal orientation of the epitaxial layer being oriented by and with respect to that of the crystalline substrate. In other words, during epitaxial crystal growth, each crystallographic domain in the newly deposited crystalline layer exhibits a crystal orientation that is derived from the crystal orientation of the crystalline substrate. An epitaxial layer deposited on a crystalline metal substrate may have substantially the same chemical composition as that of the metal substrate (homoepitaxy), or the epitaxial layer may have a substantially different chemical composition than that of the metal substrate (heteroepitaxy). When a major surface area fraction of crystal grains disposed along a surface of a crystalline material exhibit substantially the same crystal orientation in one or more axes, this crystal orientation may be referred to as the "predominant" crystal orientation and the surface of the crystalline material may be referred to as "textured" or as having a "crystallographic texture." When the crystal grains are oriented such that a specific lattice plane thereof is substantially parallel to a plane defined by the surface of the crystalline material, the crystal grains may be referred to as exhibiting a "fiber texture" and the surface of the crystalline material may be referred to as exhibiting a strong "fiber texture component."

In aspects, polycrystalline metal substrates with textured surfaces are prepared for use in negative electrodes of lithium metal batteries to help direct the crystal orientation of lithium metal crystal grains deposited via epitaxy on surfaces of negative electrode current collectors during initial charging and repeated charging cycles of lithium metal batteries. The polycrystalline metal substrates may be prepared for use as negative electrode current collectors themselves or as template layers that are mounted to surfaces of negative electrode current collectors prior to battery assembly. The textured surfaces of the metal substrates may be configured to promote the epitaxial growth of lithium metal thereon during initial charging and repeated charging cycles of the lithium metal batteries. The textured surfaces of the metal substrates may exhibit a strong fiber texture component and, in such case, may promote the epitaxial growth of lithium metal layers that likewise exhibit a strong fiber texture component. Without intending to be bound by theory, it is believed that, unlike metal substrates that are made-up of randomly oriented crystal grains, metal substrates with surfaces that exhibit a predominant crystal orientation (crystallographic texture) have a relatively homogeneous distribution of nucleation sites of equal surface energy, which may promote the relatively uniform deposition of lithium metal thereon.

The term "substantially," as used herein, means that the recited characteristic, parameter, value, or result may be, but need not be, achieved completely or exactly, and that deviations or variations, including for example, tolerances, measurement error, measurement accuracy limitations and other factors within the knowledge of those of skill in the art, may occur in amounts that do not preclude the effect the characteristic, parameter, value, or result was intended to provide. For example, a first plane that is substantially parallel to a second plane may be exactly parallel or so nearly exactly parallel to the second plane that the effect would be the same as if it were exactly parallel.

When a component, element, or layer is referred to as being "on," "connected to," "attached to," or "coupled to" another component, element, or layer, it may be directly on, connected, attached, or coupled to the other component, element, or layer, or intervening components, elements, or layers may be present. In contrast, when a component, element, or layer is referred to as being "directly on," "directly connected to," "directly attached to," or "directly coupled to" another component, element, or layer, there may be no intervening components, elements, or layers present. Other words used to describe the relationship between elements should be interpreted in a like fashion (e.g., "between" versus "directly between," "adjacent" versus "directly adjacent," etc.).

As used herein, "ionic contact" between a first component and a second component or a first component and a second component being "ionically coupled" means that the components are arranged so that it is possible for ions to move from the first component to the second component and/or vice versa. This can be achieved by using direct physical contact (common interface) or by creating an ionically conductive pathway between the first component and the second component using an ionically conductive medium or material (e.g., an electrolyte) in physical contact with the first and second components. The term "direct ionic contact," as used herein, means direct physical contact allowing for ions to be transferred between the two components.

Figure 3:
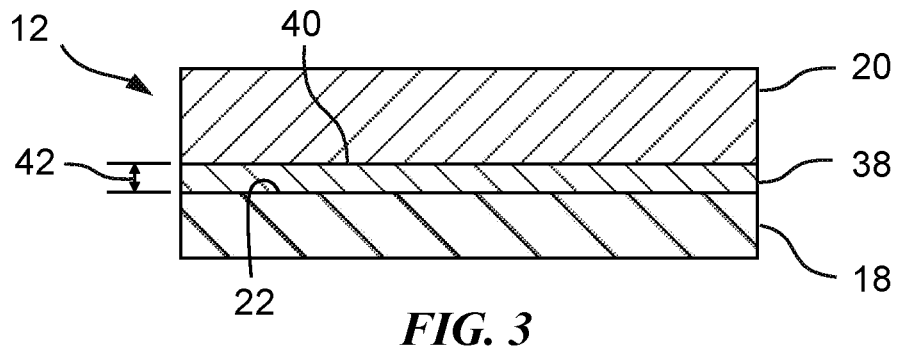
FIG. 3 is an enlarged view of a portion of the negative electrode of FIG. 1 depicting the negative electrode current collector, a lithium metal template layer formed directly on the major facing surface of the negative electrode current collector, and the epitaxial lithium metal layer formed on the major facing surface of the negative electrode current collector over the lithium metal template layer.

FIG. 1 is a schematic depiction of an electrochemical cell 10 of a secondary lithium metal battery (not shown). The electrochemical cell 10 includes a negative electrode 12, a positive electrode 14, and a nonaqueous electrolyte 16 in ionic contact with the negative electrode 12 and the positive electrode 14. The negative electrode 12 includes a negative electrode current collector 18 and a negative electrode material layer in the form of an epitaxial lithium metal layer 20 deposited on a major facing surface 22 of the negative electrode current collector 18. The negative electrode 12 optionally may include a lithium metal template layer 38 disposed on the major facing surface 22 of the negative electrode current collector 18, with the epitaxial lithium metal layer 20 being deposited on the major facing surface 22 of the negative electrode current collector 18 over the lithium metal template layer 38 (FIG. 3). The positive electrode 14 includes a positive electrode current collector 24 having a positive electrode material layer 26 disposed on an opposing major facing surface 28 of the positive electrode current collector 24. The negative and positive electrodes 12, 14 are physically spaced apart from one another and, in assembly, may be physically separated from one another by a porous separator (not shown). In assembly, the negative electrode 12 may be electrically coupled to the positive electrode 14 via an external circuit 30 that provides an electrically conductive pathway for the transfer of electrons between the negative and positive electrodes 12, 14 while lithium ions simultaneously travel through the electrolyte 16 between the epitaxial lithium metal layer 20 and the opposing positive electrode material layer 26 during cycling of the electrochemical cell 10. The negative and positive electrodes 12, 14 may be coupled to a power source 32 that supplies electric current to the positive electrode 14 during initial charging and recharging of the electrochemical cell 10.

Figure 2:
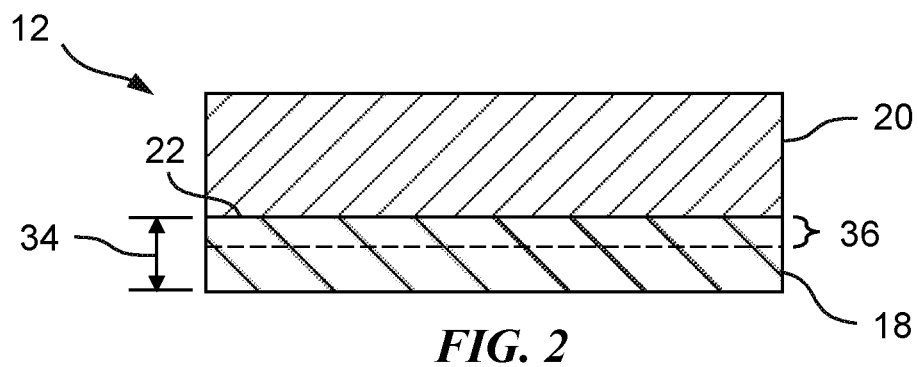
FIG. 2 is an enlarged view of a portion of the negative electrode of FIG. 1 depicting the negative electrode current collector and the epitaxial lithium metal layer formed directly on the major facing surface of the negative electrode current collector.

Referring now to FIG. 2, the major facing surface 22 of the negative electrode current collector 18 may be substantially planar and may exhibit a defined crystallographic texture that facilitates deposition of the epitaxial lithium metal layer 20 thereon during initial charging of the electrochemical cell 10, as well as the uniform plating of lithium metal thereon during repeated charging cycles of the electrochemical cell 10. A major surface area fraction of crystal grains disposed along the major facing surface 22 of the negative electrode current collector 18 may exhibit substantially the same crystal orientation as one another and may be substantially aligned with one another along at least one crystallographic axis, e.g., within less than 10 degrees or within less than 5 degrees of one another. For example, the fraction of crystal grains disposed along the major facing surface 22 of the negative electrode current collector 18 that exhibit substantially the same crystal orientation as one another may be, by surface area, greater than 50%, greater than 80%, or greater than 90% of the total surface area of the major facing surface 22 of the negative electrode current collector 18. The predominant crystal orientation of the crystal grains disposed along the major facing surface 22 of the negative electrode current collector 18 may extend at least partway through a thickness 34 of the negative electrode current collector 18. In such case, at least a surface portion 36 of the negative electrode current collector 18 may exhibit a predominant crystal orientation and a defined crystallographic texture. In some aspects, a major volume fraction of crystal grains in substantially the entire thickness 34 of the negative electrode current collector 18 may exhibit a predominant crystal orientation and a defined crystallographic texture. For example, the fraction of crystal grains in the negative electrode current collector 18 that exhibit substantially the same crystal orientation as one another may be, by volume, greater than 50%, greater than 80%, or greater than 90% of the total volume of the negative electrode current collector 18.

As shown in FIG. 3, when present, the lithium metal template layer 38 may be formed on the major facing surface 22 of the negative electrode current collector 18 prior to assembly of the electrochemical cell 10 and/or prior to initial charging of the electrochemical cell 10. In such case, the lithium metal template layer 38 may exhibit a predominant crystal orientation and a defined crystallographic texture, with a substantially planar, crystallographically textured surface 40 that facilitates deposition of the epitaxial lithium metal layer 20 thereon during initial charging of the electrochemical cell 10, as well as the uniform plating of lithium metal thereon during repeated charging cycles of the electrochemical cell 10. In other words, a major volume fraction of crystal grains in the lithium metal template layer 38 may exhibit substantially the same crystal orientation as one another and may be aligned with one another along at least one crystallographic axis, e.g., within less than 10 degrees or within less than 5 degrees of one another. For example, the fraction of crystal grains in the lithium metal template layer 38 that exhibit substantially the same crystal orientation as one another may be, by volume, greater than 50%, greater than 80%, or greater than 90% of the total volume of the lithium metal template layer 38. In some aspects, crystal grains in substantially an entire thickness 42 of the lithium metal template layer 38 may exhibit a predominant crystal orientation and a defined crystallographic texture.

The lithium metal present in the lithium metal template layer 38 during initial assembly of the electrochemical cell 10 may provide the electrochemical cell 10 with a surplus of active lithium, which may compensate for losses of active lithium that may occur during initial and repeated cycling of the electrochemical cell 10.

When the lithium metal template layer 38 is disposed on the major facing surface 22 of the negative electrode current collector 18, the major facing surface 22 of the negative electrode current collector 18 may or may not exhibit a predominant crystal orientation or a defined crystallographic texture. For example, when the lithium metal template layer 38 is disposed on the major facing surface 22 of the negative electrode current collector 18, a major volume fraction of crystal grains in the negative electrode current collector 18 and disposed along the major facing surface 22 of the negative electrode current collector 18 may exhibit random crystal orientations.

Figure 4:
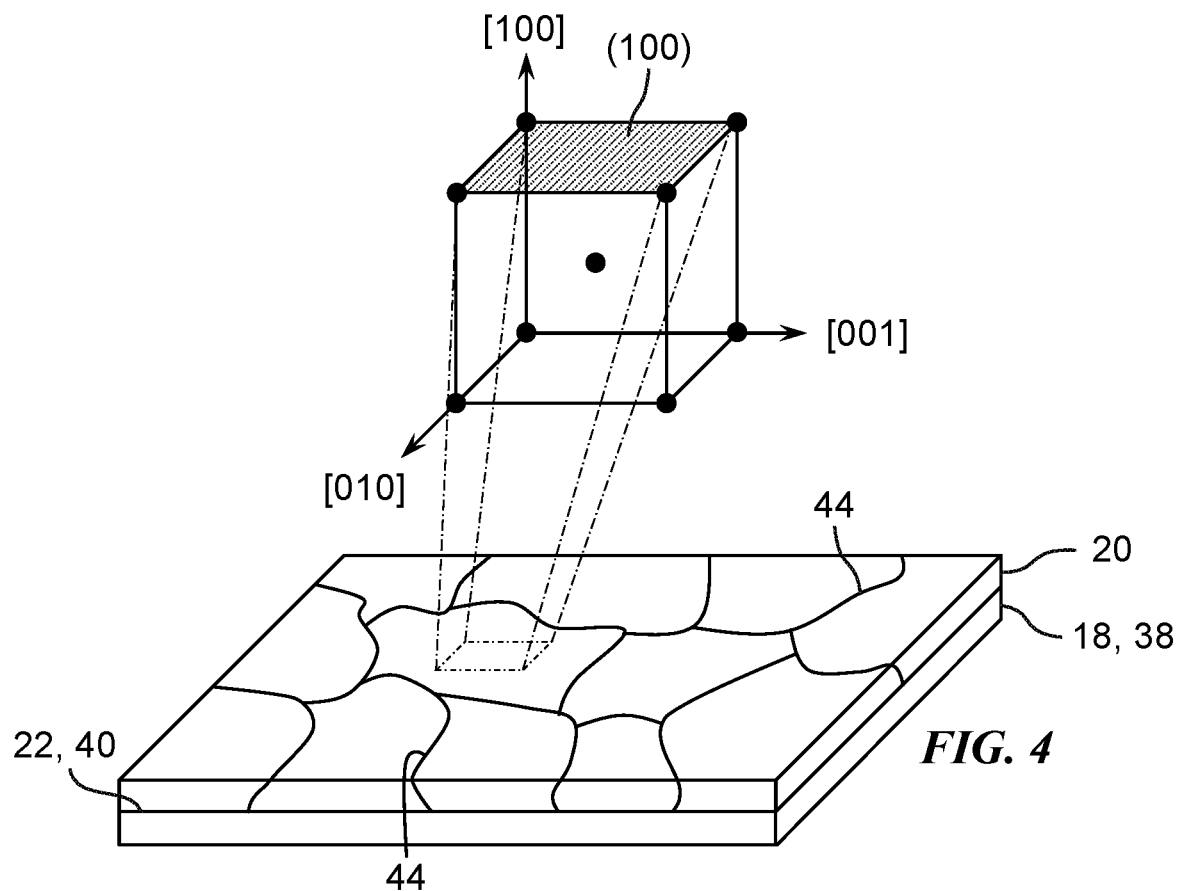
FIG. 4 is a perspective view of the epitaxial lithium metal layer of FIG. 1 depicting a crystal orientation of a lithium metal crystal grain disposed along a major surface of the epitaxial lithium metal layer, wherein the lithium metal crystal grain exhibits a <100> fiber texture and is oriented such that a {100} lattice plane thereof is oriented substantially parallel to the major surface of the epitaxial lithium metal layer.

Referring now to FIG. 4, the epitaxial lithium metal layer 20 preferably exhibits a strong fiber texture component, with a major volume fraction of crystal grains 44 in the epitaxial lithium metal layer 20 having a specific lattice plane oriented substantially parallel to a plane defined by the major facing surface 22 of the negative electrode current collector 18 (or the textured surface 40 of the lithium metal template layer 38), e.g., within less than 10 degrees or within less than 5 degrees of exactly parallel. For example, the fraction of crystal grains in the epitaxial lithium metal layer 20 that exhibit a fiber texture and have a specific lattice plane oriented substantially parallel to the major facing surface 22 of the negative electrode current collector 18 may be, by volume, greater than 50%, greater than 80%, or greater than 90% of the total volume of the epitaxial lithium metal layer 20.

A description of lattice planes and directions in a crystallographic unit cell (crystal lattice) are oftentimes described using a notation system referred to as the Miller indices, which are represented by the integers h, k, and $\ell$.

In such system, the notation (hkℓ) describes a specific lattice plane or family of planes, {hkℓ} denotes the set of lattice planes equivalent to (hkℓ) by the symmetry, [hkℓ] denotes a vector direction normal to the surface of the lattice plane (hkℓ), and <hkℓ> denotes the set of directions equivalent to [hkℓ] by symmetry. In FIG. 4, the Miller indices for the lattice axes (or edges) of a crystallographic unit cell exhibiting a cubic crystal structure are [100], [001] and [010].

A major volume fraction of crystal grains 44 in the epitaxial lithium metal layer 20 may exhibit a fiber texture and have a lattice plane {hkℓ} oriented substantially parallel to a plane defined by the major facing surface 22 of the negative electrode current collector 18, wherein h, k, and ℓ are each, individually, 0, 1, 2, or 3. In such case, the epitaxial lithium metal layer 20 may be described as having a predominant {hkℓ} crystal orientation and a strong <hkℓ> fiber texture component, meaning that, for a major volume fraction of crystal grains in the epitaxial lithium metal layer 20, the directions <hkℓ> in the lithium metal crystal lattice are oriented normal to the major facing surface 22 of the negative electrode current collector 18. In aspects of the present disclosure, the epitaxial lithium metal layer 20 may exhibit a predominant {110}, {100}, {111}, {102}, or {122} crystal orientation and/or a strong <110>, <100>, <111>, <102>, or <122> fiber texture component.

For example, as shown in FIG. 4, a major volume fraction of crystal grains 44 in the epitaxial lithium metal layer 20 may exhibit a fiber texture and have a lattice plane {100} oriented substantially parallel to the major facing surface 22 of the negative electrode current collector 18, and, in such case, the epitaxial lithium metal layer 20 may be described as having a predominant {100} crystal orientation and/or a strong <100> fiber texture component.

Figure 5:
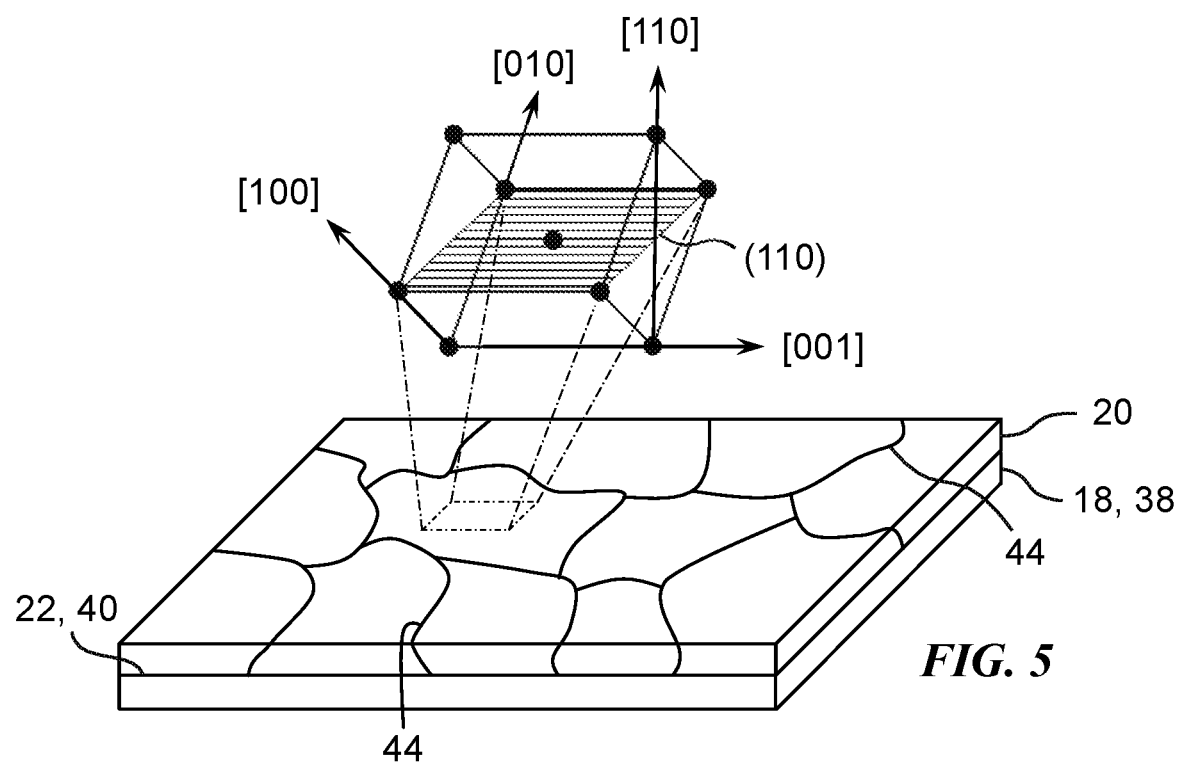
FIG. 5 is a perspective view of the epitaxial lithium metal layer of FIG. 1 depicting a crystal orientation of a lithium metal crystal grain disposed along a major surface of the epitaxial lithium metal layer, wherein the lithium metal crystal grain exhibits a <110> fiber texture and is oriented such that a {110} lattice plane thereof is oriented substantially parallel to the major surface of the epitaxial lithium metal layer.

Alternatively, as shown in FIG. 5, a major volume fraction of crystal grains 44 in the epitaxial lithium metal layer 20 may exhibit a fiber texture and have a lattice plane {110} oriented substantially parallel to the major facing surface 22 of the negative electrode current collector 18, and, in such case, the epitaxial lithium metal layer 20 may be described as having a predominant {110} crystal orientation and/or a strong <110> fiber texture component.

The predominant orientation of the crystal grains in the epitaxial lithium metal layer 20 may be selected so that the lattice plane oriented substantially parallel to the major facing surface 22 of the negative electrode current collector 18 is a plane that exhibits a close-packed morphology or a relatively close-packed morphology (compared to other lattice planes). Without intending to be bound by theory, it is believed that orienting a relatively close-packed lattice plane substantially parallel to the major facing surface 22 of the negative electrode current collector 18 may increase the rate at which lithium metal may be deposited on the major facing surface 22 of the negative electrode current collector 18 during charging of the electrochemical cell 10. Lithium metal exhibits a body-centered cubic (bcc) crystal structure at ambient temperature (e.g., 25° C.). For bcc crystal structures, the most closely packed lattice planes are the set of {110}. The close-packed lattice planes in a face-centered cubic (fcc) crystal structure are the set of {111}.

The crystallographic texture embodied by the negative electrode current collector 18 and/or the lithium metal template layer 38 is configured to direct the orientation of crystal grains in the epitaxial lithium metal layer 20 deposited on the major facing surface 22 of the negative electrode current collector 18 during initial charging and recharging of the electrochemical cell 10. For example, the crystallographic texture embodied by the negative electrode current collector 18 and/or the lithium metal template layer 38 may be selected so that lithium metal crystal grains grow epitaxially (via homoepitaxy or heteroepitaxy) on the major facing surface 22 of the negative electrode current collector 18 during charging of the electrochemical cell 10. The epitaxial growth of lithium metal crystal grains results in formation of the epitaxial lithium metal layer 20, with the epitaxial lithium metal layer 20 exhibiting a predominant crystal orientation that is based on or derived from the predominant crystal orientation of the crystal grains disposed along the major facing surface 22 of the negative electrode current collector 18 (or along the textured surface 40 of the lithium metal template layer 38). For example, a major volume fraction of crystal grains in the epitaxial lithium metal layer 20 may be in uniaxial crystallographic alignment (e.g., within less than 10 degrees or within less than 5 degrees of exact alignment) with a major surface area fraction of crystal grains disposed along the major facing surface 22 of the negative electrode current collector 18 (or along the textured surface 40 of the lithium metal template layer 38).

In some aspects, a major surface area fraction of crystal grains disposed along the major facing surface 22 of the negative electrode current collector 18 (or along the textured surface 40 of the lithium metal template layer 38) may exhibit a fiber texture and may have a lattice plane {hkℓ} oriented substantially parallel to a plane defined by the major facing surface 22 of the negative electrode current collector 18, wherein h, k, and ℓ are each, individually, 0, 1, 2, or 3. In aspects of the present disclosure, a major surface area fraction of crystal grains disposed along the major facing surface 22 of the negative electrode current collector 18 (or along the textured surface 40 of the lithium metal template layer 38) may exhibit a predominant {110}, {100}, {111}, {102}, or {122} crystal orientation and/or a <110>, <100>, <111>, <102>, or <122> fiber texture.

The negative electrode current collector 18 is configured to facilitate the transfer of free electrons to and from the epitaxial lithium metal layer 20 and may be configured to direct the orientation of lithium metal crystal grains deposited on the major facing surface 22 thereof during initial charging and recharging of the electrochemical cell 10. The negative electrode current collector 18 is made of a metal-based material that is capable of collecting and reversibly passing free electrons to and from the epitaxial lithium metal layer 20, while also exhibiting high mechanical strength as well as exceptional chemical and electrochemical stability in the operating environment of the electrochemical cell 10. The negative electrode current collector 18 may be in the form of a nonporous sheet or foil, or the negative electrode current collector 18 may be in the form of a porous mesh or a perforated sheet or foil. The negative electrode current collector 18 may have a thickness in a range of from 5 micrometers to 600 micrometers.

The term "metal-based" in which "metal" refers to a specified metal element, is used herein to refer to materials in which the specified metal element is the primary constituent of the material and constitutes the highest weight percent component of the material; other metal and/or non-metal elements may be present in the material in relatively small amounts at a lower weight percent than the specified metal element (primary constituent). For example, the negative electrode current collector 18 may be made of a metal-based material, wherein the specified metal element of the metal-based material is: copper (Cu), nickel (Ni), iron (Fe), titanium (Ti), aluminum (Al), or magnesium (Mg). In aspects, the specified metal element may account for, by weight, greater than 90%, greater than 95%, or greater than 98% of the metal-based material of the negative electrode current collector 18. In aspects, the negative electrode current collector 18 may consist essentially of copper, e.g., copper may account for, by weight, greater than 98%, greater than 99%, or greater than 99.5% of the metal-based material of the negative electrode current collector 18. At ambient temperature (e.g., 25° C.), the metal-based material of the negative electrode current collector 18 may exhibit a cubic crystal structure, e.g., a body-centered cubic (bcc) or face-centered cubic (fcc) crystal structure, a hexagonal close-packed (hcp) crystal structure, or a body-centered tetragonal (bct) crystal structure, depending on the composition of the negative electrode current collector 18 and/or on the method(s) of forming the negative electrode current collector 18. For example, copper-based, nickel-based, and aluminum-based materials generally exhibit a fcc crystal structure at ambient temperature. Titanium-based and magnesium-based materials generally exhibit a hcp crystal structure at ambient temperature. Iron-based materials may exhibit a bcc, fcc, or bct crystal structure, depending on their specific composition and processing methods.

Lithium metal exhibits a body-centered cubic (bcc) crystal structure at ambient temperature. As such, in aspects of the present disclosure where the epitaxial lithium metal layer 20 is deposited directly on the major facing surface 22 of the negative electrode current collector 18, the negative electrode current collector 18 may comprise a metal-based material that exhibits a cubic crystal structure, e.g., a body-centered cubic (bcc) or face-centered cubic (fcc) crystal structure at ambient temperature, which may promote a high degree of lattice matching between the epitaxial lithium metal layer 20 and the negative electrode current collector 18 when the epitaxial lithium metal layer 20 is deposited directly on the major facing surface 22 of the negative electrode current collector 18.

The lithium metal template layer 38, when present, is configured to direct the orientation of lithium metal crystal grains deposited on the textured surface 40 thereof during initial charging and subsequent charging cycles of the electrochemical cell 10, without impeding the transfer of electrons between the negative electrode current collector 18 and the epitaxial lithium metal layer 20 during operation of the electrochemical cell 10. The lithium metal template layer 38 may consist essentially of lithium (Li) metal or may comprise an alloy of lithium and one or more alloying elements, e.g., one or more of indium (In), tin (Sn), gallium (Ga), zinc (Zn), aluminum (Al), magnesium (Mg), silicon (Si), calcium (Ca), or sodium (Na). Such alloying element(s) may be present in the lithium metal template layer 38, on an atomic basis, in amounts less than 1% of the lithium metal template layer 38. For example, the lithium metal template layer 38 may comprise, by weight, greater than 85% lithium, greater than 95% lithium, or greater than 97% lithium, or greater than 99% lithium based upon the overall weight of the lithium metal template layer 38. The one or more alloying elements may be present in the lithium metal template layer 38 in an amount, by weight, of greater than 3%, less than 15%, or from 3% to 15% of the lithium metal template layer 38.

In aspects, the lithium metal template layer 38 may be substantially free of elements or compounds that are configured to undergo a reversible redox reaction with lithium during operation of the electrochemical cell 10. For example, the lithium metal template layer 38 may be substantially free of electrochemically active materials that are configured to (i) undergo the intercalation and/or deintercalation of lithium ions, (ii) alloy with lithium during charging of the electrochemical cell 10, and/or (iii) undergo a reversible conversion reaction with lithium. Examples of materials that may be excluded from the lithium metal template layer 38 include carbon-based materials (e.g., graphite, activated carbon, carbon black, and graphene), tin oxide, cadmium, lead, germanium, antimony, titanium oxide, lithium titanium oxide, lithium titanate, lithium oxide, metal oxides (e.g., iron oxide, cobalt oxide, manganese oxide, copper oxide, nickel oxide, chromium oxide, ruthenium oxide, and/or molybdenum oxide), metal phosphides, metal sulfides, and metal nitrides (e.g., phosphides, sulfides, and/or nitrides or iron, manganese, nickel, copper, and/or cobalt). In aspects, the lithium metal template layer 38 may be substantially free of a polymeric binder. Examples of polymeric binders that may be excluded from the lithium metal template layer 38 include polyvinylidene fluoride (PVdF), ethylene propylene diene monomer (EPDM) rubber, styrene butadiene rubber (SBR), carboxymethyl cellulose (CMC), and polyacrylic acid.

The lithium metal template layer 38 may be in the form of a nonporous sheet or foil and may have a thickness of greater than 1 μm, greater than 2 μm, greater than 5 μm, less than 100 μm, less than 50 μm, less than 25 μm, or from 1 μm to 100 μm, from 2 μm to 50 μm, or from 5 μm to 25 μm.

The epitaxial lithium metal layer 20 may be nonporous and may consist essentially of lithium (Li) metal. For example, the epitaxial lithium metal layer 20 may comprise, by weight, greater than 97% lithium, greater than 99% lithium, or greater than 99.9% lithium.

The nonaqueous electrolyte 16 is ionically conductive and provides an ionically conductive pathway for the transfer of lithium ions between the positive electrode material layer 26 and the epitaxial lithium metal layer 20 (and/or the major facing surface 22 of the negative electrode current collector 18 and/or the textured surface 40 of the lithium metal template layer 38) during initial charging and subsequent operation of the electrochemical cell 10. In assembly, the electrochemical cell 10 may be infiltrated with the nonaqueous electrolyte 16 such that the epitaxial lithium metal layer 20 (and/or the major facing surface 22 of the negative electrode current collector 18 and/or the textured surface 40 of the lithium metal template layer 38) and the positive electrode material layer 26 are in physical contact with, e.g., by being wet with, the nonaqueous electrolyte 16. The nonaqueous electrolyte 16 may be in the form of a nonaqueous liquid electrolyte solution, a gel electrolyte, or a solid electrolyte. When the nonaqueous electrolyte 16 is in the form of a nonaqueous liquid electrolyte solution, the nonaqueous electrolyte 16 may comprise a lithium salt dissolved or ionized in a nonaqueous, aprotic organic solvent or a mixture of nonaqueous, aprotic organic solvents.

Examples of lithium salts include $LiClO_4$, $LiAlCl_4$, LiI, LiBr, LiSCN, $LiBF_4$, $LiB(C_6H_5)_4$, $LiAsF_6$, $LiCF_3SO_3$, $LiN(CF_3SO_2)_2$, $Li_2CO_3$, $LiPF_6$, and combinations thereof. Examples of nonaqueous, aprotic organic solvents include cyclic carbonates (i.e., ethylene carbonate, propylene carbonate), acyclic carbonates (i.e., dimethyl carbonate, diethyl carbonate, ethyl methyl carbonate), aliphatic carboxylic esters (i.e., methyl formate, methyl acetate, methyl propionate), γ-lactones (i.e., γ-butyrolactone, γ-valerolactone), acyclic ethers (i.e., 1,2-dimethoxyethane, 1,2-diethoxyethane, ethoxymethoxyethane), and/or cyclic ethers (i.e., tetrahydrofuran, 2-methyltetrahydrofuran). When the nonaqueous electrolyte 16 is in the form of a gel or plasticized polymer electrolyte, the nonaqueous electrolyte 16 may comprise a polymer host material soaked with a nonaqueous liquid electrolyte solution. Examples of polymer host materials include poly(vinylidene) (PVdF), poly(acrylonitrile) (PAN), poly(methyl methacrylate) (PMMA), poly(ethylene oxide) (PEO), polyacrylates, and poly(vinylidene fluoride-hexafluoropropylene) (PVdF-HFP).

The positive electrode current collector 24 is configured to facilitate the transfer of free electrons to and from the positive electrode material layer 26 and may be in the form of a nonporous sheet or foil. The positive electrode current collector 24 may comprise a material that can collect and reversibly pass free electrons to and from the positive electrode material layer 26. For example, the positive electrode current collector 24 may comprise an electrically conductive metal, e.g., a transition metal or alloy thereof. In aspects, the positive electrode current collector 24 may comprise aluminum, nickel, or an iron alloy (e.g., stainless steel).

The positive electrode material layer 26 is porous and may comprise one or more electrochemically active materials (e.g., elements or compounds) capable of undergoing a reversible redox reaction with lithium. For example, the positive electrode material layer 26 may comprise a material that is capable of (i) undergoing the intercalation and deintercalation of lithium ions, (ii) alloying and dealloying with lithium, and/or (iii) undergoing a reversible conversion reaction with lithium. In one form, the positive electrode material layer 26 may comprise an intercalation host material that can undergo the reversible insertion or intercalation of lithium ions. In such case, the intercalation host material of the positive electrode material layer 26 may comprise a layered oxide represented by the formula $LiMeO_2$, an olivine-type oxide represented by the formula $LiMePO_4$, a spinel-type oxide represented by the formula $LiMe_2O_4$, a tavorite represented by one or both of the following formulas $LiMeSO_4F$ or $LiMePO_4F$, or a combination thereof, where Me is a transition metal (e.g., Co, Ni, Mn, Fe, Al, V, or a combination thereof). In another form, the positive electrode material layer 26 may comprise a conversion material including a component that can undergo a reversible electrochemical reaction with lithium, in which the component undergoes a phase change or a change in crystalline structure accompanied by a change in oxidation state. In such case, the conversion material of the positive electrode material layer 26 may comprise sulfur, selenium, tellurium, iodine, a halide (e.g., a fluoride or chloride), sulfide, selenide, telluride, iodide, phosphide, nitride, oxide, oxysulfide, oxyfluoride, sulfur-fluoride, sulfur-oxyfluoride, or a lithium and/or metal compound thereof. Examples of suitable metals for inclusion in the conversion material of the positive electrode material layer 26 include iron, manganese, nickel, copper, and cobalt.

The electrochemically active material(s) of the positive electrode material layer 26 may be intermingled with a polymeric binder to provide the positive electrode material layer 26 with structural integrity. Examples of polymeric binders include polyvinylidene fluoride (PVdF), ethylene propylene diene monomer (EPDM) rubber, styrene butadiene rubber (SBR), carboxymethyl cellulose (CMC), polyacrylic acid, and mixtures thereof. The positive electrode material layer 26 optionally may include particles of an electrically conductive material, which may comprise very fine particles of, for example, high-surface area carbon black. The electrochemically active material(s) may account for, by weight, from 50% to 90% of the positive electrode material layer 26, the polymeric binder may account for, by weight, from 5% to 30% of the positive electrode material layer 26, and the electrically conductive material may account for, by weight, 5% to 40% of the positive electrode material layer 26.

Methods

A method of manufacturing the negative electrode 12 of the electrochemical cell 10 may include: providing a polycrystalline metal substrate having a textured surface, with at least a surface portion of the polycrystalline metal substrate exhibiting a predominant crystal orientation and depositing an epitaxial lithium metal layer on the textured surface of the polycrystalline metal substrate via an electrochemical deposition process.

The polycrystalline metal substrate may comprise substantially the same material as that of the negative electrode current collector 18 and may exhibit substantially the same thickness. Or the polycrystalline metal substrate may comprise substantially the same material as that of the lithium metal template layer 38 and may exhibit substantially the same thickness. In aspects, the polycrystalline metal substrate may comprise a multilayer laminate and may include a base layer made of substantially the same material as that of the negative electrode current collector 18 and having substantially the same thickness, and a lithium metal layer overlying the base layer, with the lithium metal layer being made of substantially the same material as that of the lithium metal template layer 38 and having substantially the same thickness. In such case, the lithium metal layer may be applied to the base layer by an electrochemical deposition process, by exposing the base layer to molten lithium, using a vapor deposition process (e.g., an atomic layer deposition process or a physical vapor deposition process), and/or by pressing or rolling the lithium metal layer onto the base layer.

At least the surface portion of the polycrystalline metal substrate may be subjected to a mechanical surface treatment process and/or a heat treatment process to impart a desired crystal orientation to a major volume fraction of crystal grains disposed within at least the surface portion of the polycrystalline metal substrate, i.e., crystal grains disposed along and defining a major surface of the polycrystalline metal substrate. For example, a desired crystal orientation may be imparted to a major volume fraction of crystal grains disposed within at least the surface portion of the polycrystalline metal substrate by subjecting the major surface of the polycrystalline metal substrate to a rolling treatment followed by an annealing or recrystallization treatment. During the rolling treatment, the polycrystalline metal substrate may be passed between a set or pair of rollers, or a single roller may be passed over the major surface of the polycrystalline metal substrate. The roller(s) may be coated with a chemically inert nonstick or adhesion resistant coating, e.g., a coating of titanium nitride, titanium carbide, and/or aluminum oxide ($Al_2O_3$). The rolling treatment may be performed in an inert gas environment (e.g., an argon cover gas) or a subatmospheric pressure environment (e.g., less than 1 Atm) to prevent undesirable chemical reactions between the polycrystalline metal substrate and the surrounding gaseous environment.

The specific crystal orientation imparted to the crystal grains in at least the surface portion of the polycrystalline metal substrate may be determined based upon suitable control and/or adjustment of one or more parameters during the rolling treatment. For example, the specific crystal orientation imparted to the crystal grains in at least the surface portion of the polycrystalline metal substrate may be controlled by suitable selection of the rolling speed, percent (%) reduction in the thickness of the polycrystalline metal substrate during the rolling treatment, temperature of the polycrystalline metal substrate during the rolling treatment (e.g., cold rolled, ambient temperature, or hot rolled), number of times the polycrystalline metal substrate is subjected to the rolling treatment, the direction of the roller(s) with respect to the major surface of the polycrystalline metal substrate, and/or the change in the rolling direction (if any) between subsequent passes of the roller(s). The specific crystal orientation imparted to the polycrystalline metal substrate also may be controlled and/or adjusted based upon the parameters of the subsequent annealing treatment. As discussed above with respect to the lithium metal template layer 38, one or more alloying elements (e.g., one or more of In, Sn, Ga, Zn, Al, Mg, or Si) may be included in the polycrystalline metal substrate to help control and/or adjust the crystal orientation imparted to the polycrystalline metal substrate during the rolling treatment and/or the annealing treatment. After the desired crystal orientation is established in at least the surface portion of the polycrystalline metal substrate, the major surface of the polycrystalline metal substrate will exhibit a predominant crystal orientation and may be referred to as "textured."

An epitaxial lithium metal layer may be formed on the textured surface of the polycrystalline metal substrate using an electrochemical deposition process. The electrochemical deposition process may be performed before or after assembly of the electrochemical cell 10. For example, the electrochemical deposition process may be performed during initial charging of the electrochemical cell 10.

In aspects where the polycrystalline metal substrate comprises substantially the same material as that of the negative electrode current collector 18 (or comprises a multilayer laminate including a base layer and an overlying lithium metal layer), the polycrystalline metal substrate may be assembled into the electrochemical cell 10 and used as the negative electrode current collector of the electrochemical cell 10 prior to or after formation of the epitaxial lithium metal layer thereon. Or a lithium metal layer may be deposited on the textured surface of the polycrystalline metal substrate prior to incorporating the polycrystalline metal substrate into the electrochemical cell 10 and using the polycrystalline metal substrate as the negative electrode current collector of the electrochemical cell 10. In aspects where the polycrystalline metal substrate comprises substantially the same material as that of the lithium metal template layer 38, the polycrystalline metal substrate may be attached or applied to a major surface of a negative electrode current collector prior to formation of the epitaxial lithium metal layer thereon and/or prior to assembly of the electrochemical cell 10.

During the electrochemical deposition process, the polycrystalline metal substrate may be positioned in spaced-apart relationship with and in ionic contact with an electrochemically active material that includes a source of active lithium. In aspects, the electrochemically active material may comprise the same electrochemically active material(s) as that of the positive electrode material layer 26. The polycrystalline metal substrate may be positioned in spaced-apart relationship with and in ionic contact with the electrochemically active material, for example, by immersing or placing the polycrystalline metal substrate and the electrochemically active material in direct physical contact with a nonaqueous liquid electrolyte solution. An electrically conductive pathway may be established between the polycrystalline metal substrate and the electrochemically active material by electrically coupling the polycrystalline metal substrate and the electrochemically active material to a power source via an external circuit.

An electrical potential is established between the polycrystalline metal substrate and the electrochemically active material to initiate the electrochemical deposition process. The electrical potential established between the polycrystalline metal substrate and the electrochemically active material promotes the oxidation of lithium in the electrochemically active material and the release of lithium ions from the electrochemically active material into the nonaqueous electrolyte. The lithium ions released into the nonaqueous electrolyte are reduced to lithium metal and deposited, e.g., via epitaxy, on the textured surface of the polycrystalline metal substrate. The electrical potential between the polycrystalline metal substrate and the electrochemically active material may be maintained until the electrochemically active material is substantially depleted of active lithium and a substantially uniform epitaxial lithium metal layer has formed on the textured surface of the polycrystalline metal substrate.

In aspects where the polycrystalline metal substrate comprises substantially the same material as that of the negative electrode current collector 18 and the epitaxial lithium metal layer is formed directly on the polycrystalline metal substrate, lithium ions may be deposited on the textured surface of the polycrystalline metal substrate via heteroepitaxy. In aspects where the textured surface of the polycrystalline metal substrate comprises substantially the same material as that of the lithium metal template layer 38, lithium ions may be deposited on the textured surface of the polycrystalline metal substrate via homoepitaxy. In aspects where the polycrystalline metal substrate is in the form of a multilayer laminate (e.g., including a base layer and an overlying lithium metal layer), the composition of the material that defines the textured surface of the polycrystalline metal substrate on which the lithium ions are deposited determines whether the epitaxial lithium metal layer is formed on the textured surface of the polycrystalline metal substrate via heteroepitaxy or homoepitaxy.

During the electrochemical deposition process, the crystal orientation of the lithium metal crystal grains deposited on the textured surface of the polycrystalline metal substrate may be derived from or based upon the predominant crystal orientation exhibited by the crystal grains that define the textured surface of the polycrystalline metal substrate. As such, a major volume fraction of the crystal grains in the resulting epitaxial lithium metal layer likewise may exhibit a predominant crystal orientation and a crystallographic texture. For example, a major volume fraction of crystal grains in the epitaxial lithium metal layer may exhibit a fiber texture.

After the electrochemically active material is substantially depleted of lithium and the epitaxial lithium metal layer is formed on the textured surface of the polycrystalline metal substrate, the electrochemical cell 10 may be used to supply power to a load device. In such case, the electrochemically active material and the polycrystalline metal substrate may be disconnected from the power source and connected to the load device via the external circuit. The chemical potential difference between the electrochemically active material and the epitaxial lithium metal layer will drive the spontaneous oxidation of lithium at the surface of the epitaxial lithium metal layer and the release of lithium ions from the epitaxial lithium metal layer into the nonaqueous electrolyte. The lithium ions released into the nonaqueous electrolyte will be reduced to lithium metal and alloyed with or intercalated into the electrochemically active material.

Without intending to be bound by theory, it is believed that imparting a crystallographic texture, e.g., a fiber texture, to at least a surface portion of the polycrystalline metal substrate helps create a uniform distribution of nucleation sites on the surface of the polycrystalline metal substrate with equal surface energy. This uniform distribution of nucleation sites, in turn, is believed to promote the relatively uniform deposition of lithium metal on the surface of the polycrystalline metal substrate by avoiding the formation of lithium metal clusters or dendrites on the surface of the polycrystalline metal substrate in areas of the substrate that may be more energetically favorable. These and other benefits will be readily appreciated by those of ordinary skill in the art in view of the forgoing disclosure.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. An electrochemical cell for a secondary lithium metal battery, the electrochemical cell comprising:
    a positive electrode including a positive electrode material layer disposed on a major surface of a positive electrode current collector;
    a negative electrode spaced apart from the positive electrode; and
    a nonaqueous electrolyte in ionic contact with the positive electrode and the negative electrode,
    wherein the negative electrode includes:
        a polycrystalline metal substrate having a major facing surface with a defined crystallographic texture, and
        an epitaxial lithium metal layer formed on the major facing surface of the polycrystalline metal substrate,
        wherein the epitaxial lithium metal layer exhibits a predominant crystal orientation,
        wherein the predominant crystal orientation of the epitaxial lithium metal layer is derived from the defined crystallographic texture of the major facing surface of the polycrystalline metal substrate, and
        wherein a major volume fraction of crystal grains in the epitaxial lithium metal layer have a fiber texture of <102> or <122>.

2. The electrochemical cell of claim 1 wherein a major volume fraction of crystal grains in the epitaxial lithium metal layer have a {102} lattice plane or a {122} lattice plane oriented substantially parallel to the major facing surface of the polycrystalline metal substrate.

3. The electrochemical cell of claim 1 wherein the polycrystalline metal substrate is made of a metal-based material, a primary constituent of the metal-based material is copper (Cu), nickel (Ni), iron (Fe), titanium (Ti), aluminum (Al), or magnesium (Mg), and wherein the epitaxial lithium metal layer is formed directly on the polycrystalline metal substrate via heteroepitaxy.

4. The electrochemical cell of claim 3 wherein the polycrystalline metal substrate exhibits a body-centered cubic (bcc) crystal structure, a face-centered cubic (fcc) crystal structure, a hexagonal close-packed (hcp) crystal structure, or a body-centered tetragonal (bct) crystal structure, and wherein the epitaxial lithium metal layer exhibits a body-centered cubic (bcc) crystal structure.

5. The electrochemical cell of claim 1 wherein the polycrystalline metal substrate includes a lithium metal template layer, wherein the major facing surface of the polycrystalline metal substrate is defined by the lithium metal template layer, and wherein the epitaxial lithium metal layer is formed directly on and over the lithium metal template layer via homoepitaxy.

6. The electrochemical cell of claim 5 wherein the lithium metal template layer exhibits a body-centered cubic (bcc) crystal structure, and wherein the epitaxial lithium metal layer exhibits a body-centered cubic (bcc) crystal structure.

7. The electrochemical cell of claim 5 wherein the lithium metal template layer is nonporous and includes an alloy of lithium and at least one alloying element of indium (In), tin (Sn), gallium (Ga), zinc (Zn), aluminum (Al), magnesium (Mg), silicon (Si), calcium (Ca), or sodium (Na).

8. The electrochemical cell of claim 5 wherein the epitaxial lithium metal layer is formed directly on and over the lithium metal template layer by an electrochemical deposition process during charging of the electrochemical cell.

9. The electrochemical cell of claim 5 wherein the lithium metal template layer is applied to a major surface of a negative electrode current collector prior to initial charging of the electrochemical cell, and wherein the lithium metal template layer has a thickness in a range of from 1 µm to 100 µm.

10. The electrochemical cell of claim 5 wherein the positive electrode material layer includes a source of active lithium, wherein the positive electrode material layer includes an electrochemically active material configured to undergo a reversible redox reaction with lithium, and wherein the lithium metal template layer provides the electrochemical cell with a stoichiometric surplus of lithium prior to initial charging of the electrochemical cell.

11. A method of making a lithium metal negative electrode for an electrochemical cell of a secondary lithium metal battery, the method comprising:
    positioning a major facing surface of a polycrystalline metal substrate in spaced-apart relationship with an electrochemically active material layer including lithium, the major facing surface of the polycrystalline metal substrate exhibiting a defined crystallographic texture;
    establishing an ionically conductive pathway between the major facing surface of the polycrystalline metal substrate and the electrochemically active material layer; and
    establishing an electrical potential between the polycrystalline metal substrate and the electrochemically active material layer such that lithium ions are released from the electrochemically active material layer and lithium metal is deposited on the major facing surface of the polycrystalline metal substrate to form an epitaxial lithium metal layer thereon,
    wherein the epitaxial lithium metal layer exhibits a predominant crystal orientation,
    wherein the predominant crystal orientation of the epitaxial lithium metal layer is derived from the defined crystallographic texture of the major facing surface of the polycrystalline metal substrate, and wherein a major volume fraction of crystal grains in the epitaxial lithium metal layer have a fiber texture of <102> or <122>.

12. The method of claim 11 wherein the polycrystalline metal substrate is made of a metal-based material, a primary constituent of the metal-based material is copper (Cu), nickel (Ni), iron (Fe), titanium (Ti), aluminum (Al), or magnesium (Mg), and wherein the epitaxial lithium metal layer is formed directly on the polycrystalline metal substrate via heteroepitaxy.

13. The method of claim 11 wherein the polycrystalline metal substrate includes a lithium metal template layer, the major facing surface of the polycrystalline metal substrate is defined by the lithium metal template layer, and wherein the epitaxial lithium metal layer is formed directly on and over the lithium metal template layer by homoepitaxy.

14. The method of claim 11 wherein the ionically conductive pathway is established between the major facing surface of the polycrystalline metal substrate and the electrochemically active material layer by placing the major facing surface of the polycrystalline metal substrate and the electrochemically active material layer in direct physical contact with a nonaqueous electrolyte.

15. A method of making a lithium metal negative electrode for an electrochemical cell of a secondary lithium metal battery, the method comprising:
   imparting a defined crystallographic texture to a lithium metal foil such that a major volume fraction of crystal grains in the lithium metal foil exhibit a fiber texture of <102> or <122>;
   applying the lithium metal foil to a major surface of a negative electrode current collector;
   positioning a major facing surface of the lithium metal foil in spaced-apart relationship with an electrochemically active material layer including lithium, wherein the electrochemically active material layer is disposed on a major surface of a positive electrode current collector;
   establishing an ionically conductive pathway between the major facing surface of the lithium metal foil and the electrochemically active material layer; and
   establishing an electrical potential between the negative electrode current collector and the positive electrode current collector such that lithium ions are released from the electrochemically active material layer and lithium metal is deposited via epitaxy on the major facing surface of the lithium metal foil to form an epitaxial lithium metal layer thereon,
   wherein the epitaxial lithium metal layer exhibits a predominant crystal orientation, and
   wherein the predominant crystal orientation of the epitaxial lithium metal layer is derived from the defined crystallographic texture of the lithium metal foil.

16. The electrochemical cell of claim 1 wherein greater than 90% of the crystal grains in the epitaxial lithium metal layer have the same lattice plane oriented substantially parallel to the major facing surface of the polycrystalline metal substrate.

17. The electrochemical cell of claim 3 wherein the polycrystalline metal substrate exhibits a face-centered cubic (fcc) crystal structure, a hexagonal close-packed (hcp) crystal structure, or a body-centered tetragonal (bct) crystal structure, and wherein the epitaxial lithium metal layer exhibits a body-centered cubic (bcc) crystal structure.

18. The electrochemical cell of claim 5 wherein the epitaxial lithium metal layer is made of the same material as that of the lithium metal template layer.

19. The electrochemical cell of claim 18 wherein the lithium metal template layer comprises, by weight, greater than 99% lithium.

20. The electrochemical cell of claim 9 wherein the epitaxial lithium metal layer has a thickness in a range of from 1 μm to 100 μm.

* * * * *